US012696409B2

(12) United States Patent
Zhong

(10) Patent No.: US 12,696,409 B2
(45) Date of Patent: Jul. 28, 2026

(54) TRAY AND ELECTRONIC DEVICE

(71) Applicant: Wistron Corp., New Taipei City (TW)

(72) Inventor: Yong-Qing Zhong, New Taipei City (TW)

(73) Assignee: Wistron Corp., New Taipei Cit (TW)

( * ) Notice: Subject to any disclaimer, the term of this patent is extended or adjusted under 35 U.S.C. 154(b) by 277 days.

(21) Appl. No.: 17/982,408

(22) Filed: Nov. 7, 2022

(65) Prior Publication Data

US 2024/0074080 A1     Feb. 29, 2024

(30) Foreign Application Priority Data

Aug. 24, 2022     (CN) .......................... 202211019136.8

(51) Int. Cl.
H05K 7/00          (2006.01)
H05K 5/02          (2006.01)
H05K 7/14          (2006.01)

(52) U.S. Cl.
CPC ......... H05K 7/1411 (2013.01); H05K 5/0221 (2013.01); H05K 7/1489 (2013.01)

(58) Field of Classification Search
CPC ................................ H05K 7/1489; G06F 1/16
See application file for complete search history.

(56) References Cited

U.S. PATENT DOCUMENTS 6,105,241 A * 8/2000 Ogle ................... H01L 21/4882
                                                          29/760
6,862,174 B2 * 3/2005 Chien ..................... G06F 1/187
                                                          361/679.33

7,443,663 B2 * 10/2008 Chen ........................ G06F 1/187
                                                          720/623
8,054,624 B2 * 11/2011 Chen ........................ G06F 1/187
                                                          361/679.33
9,386,722 B2 * 7/2016 Xu ......................... H05K 7/1487
9,468,125 B2 * 10/2016 Peng .................... G11B 33/128
9,482,385 B2 * 11/2016 Braucht ............... F16M 13/022
9,629,291 B1 * 4/2017 Chen ........................ G06F 1/186
9,807,900 B2 * 10/2017 Hu ...................... G11B 33/0466
(Continued)

FOREIGN PATENT DOCUMENTS

CN          105573425 A       5/2016
CN          110362161 A       10/2019
(Continued)

OTHER PUBLICATIONS

China Patent Office, Office Action, Patent Application Serial No. CN202211019136.8, Apr. 23, 2026, China.

*Primary Examiner* — Imani N Hayman
*Assistant Examiner* — Rashen E Morrison

(57)          ABSTRACT

A tray is provided for an electronic device, and the tray includes a base and a baffle. The base has a bottom surface, a first sidewall and a second sidewall that are connected to the bottom surface. The first sidewall is connected to the second sidewall. The second sidewall has a plurality of opening portions. The baffle is rotatably connected to the first sidewall of the base. The baffle is used to rotate relative to the opening portions. Accordingly, the rotation of the baffle may adjust the flow rate and the angle of the air flowing through the opening portions. In addition, the baffle may also be accommodated in the base, and thereby electronic components may be held over the tray and the baffle.

21 Claims, 17 Drawing Sheets

(56) References Cited

U.S. PATENT DOCUMENTS

| | | | | |
|---|---|---|---|---|
| 9,826,658 B1 * | 11/2017 | Mao | G06F 1/183 |
| 10,088,877 B2 * | 10/2018 | Lu | H01R 12/721 |
| 10,104,803 B1 * | 10/2018 | Lin | H05K 7/16 |
| 10,146,271 B1 * | 12/2018 | Pav | G06F 1/20 |
| 10,168,747 B2 * | 1/2019 | Zhu | H05K 7/1489 |
| 10,212,840 B2 * | 2/2019 | Kuan | H05K 7/1487 |
| 10,251,300 B1 * | 4/2019 | Mao | H05K 7/1487 |
| 10,368,460 B1 | 7/2019 | Yang et al. | |
| 11,013,137 B2 * | 5/2021 | Chen | H05K 7/1487 |
| 11,071,228 B2 * | 7/2021 | Hershey | H05K 9/0062 |
| 11,178,787 B2 * | 11/2021 | Peng | H05K 5/0247 |
| 11,439,033 B2 * | 9/2022 | Mao | H05K 7/1457 |
| 11,997,821 B2 * | 5/2024 | Wang | H05K 7/1487 |
| 2006/0290246 A1 * | 12/2006 | Chen | G11B 33/124 |
| 2013/0100593 A1 * | 4/2013 | Yin | H05K 7/1489 |
| | | | 361/679.01 |
| 2020/0100383 A1 * | 3/2020 | Hershey | H05K 9/0062 |

FOREIGN PATENT DOCUMENTS

| | | | | |
|---|---|---|---|---|
| TW | 201225826 A | * | 6/2012 | G06F 1/16 |
| TW | 201225826 A1 | | 6/2021 | |
| TW | M321002 U | | 12/2021 | |

* cited by examiner

101

101

TRAY AND ELECTRONIC DEVICE

CROSS REFERENCE TO RELATED APPLICATIONS

This application claims priority of China Patent Application No. 202211019136.8, filed on Aug. 24, 2022, the entirety of which is incorporated by reference herein.

BACKGROUND

Technical Field

The disclosure relates to a tray and an electronic device, and in particular to a tray and an electronic device including a rotatable baffle.

Description of the Related Art

With the development of technology, large electronic apparatuses, such as computers and servers, have gradually become indispensable parts of daily life. An electronic apparatus is usually provided with electronic devices (e.g., a chassis), for example, to accommodate additional electronic components and provide extended functionality. However, there is still room for improvement in making the installation and maintenance of existing electronic devices more convenient.

BRIEF SUMMARY

The present disclosure provides a tray. The tray is provided for an electronic device, and the tray includes a base and a baffle. The base has a bottom surface, a first sidewall and a second sidewall, wherein the first sidewall and the second sidewall are connected to the bottom surface, and a plurality of opening portions are formed on the second sidewall. The baffle is rotatably connected to the first sidewall of the base and selectively rotates toward the opening portions.

The present disclosure provides an electronic device. The electronic device includes a chassis, at least one fan disposed in the chassis and a tray. The tray is removably disposed in the chassis, and includes a base and a baffle. The base has a bottom surface, a first sidewall and a second sidewall, wherein the first sidewall and the second sidewall are connected to the bottom surface, a plurality of opening portions are formed on the second sidewall, and the opening portions correspond to the fan. The baffle is rotatably connected to the first sidewall of the base and selectively rotates toward the opening portions.

BRIEF DESCRIPTION OF THE DRAWINGS

The disclosure may be more fully understood by reading the subsequent detailed description and examples with references made to the accompanying drawings, wherein.

DETAILED DESCRIPTION OF THE INVENTION

The tray and the electronic device of some embodiments of the present disclosure are described in the following description. However, it should be appreciated that the following detailed description of some embodiments of the disclosure provides various concepts of the present disclosure which may be performed in specific backgrounds that may vary widely. The specific embodiments disclosed are provided merely to clearly describe the usage of the present disclosure by some specific methods without limiting the scope of the present disclosure.

In addition, relative terms such as "lower" or "bottom," "upper" or "top" may be used in the following embodiments in order to describe the relationship between one element and another element in the figures. It should be appreciated that if the device shown in the figures is flipped upside-down, the element located on the "lower" side may become the element located on the "upper" side.

It should be understood that although the terms "first," "second," etc. may be used herein to describe various elements, materials and/or portions, these elements, materials and/or portions are not limited by the above terms. These terms merely serve to distinguish different elements, materials and/or portions. Therefore, a first element, material and/or portion may be referred to as a second element, material and/or portion without departing from the teaching of some embodiments in the present disclosure. Unless defined otherwise, the first or second element, material and/or portion in the claims may be interpreted as any element, material and/or portion in the specification as long as it conforms to the description in the claims.

Unless defined otherwise, all terms (including technical and scientific terms) used herein have the same meaning as commonly understood by one of ordinary skill in the art to which the present disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure. In addition, the terms "substantially," "approximately" or "about" may also be recited in the present disclosure, and these terms are intended to encompass situations or ranges that is substantially or exact the same as the description herein. It should be noted that unless defined specifically, even if the above terms are not recited in the description, it should be read as the same meaning as those approximate terms are recited.

Figure 1:
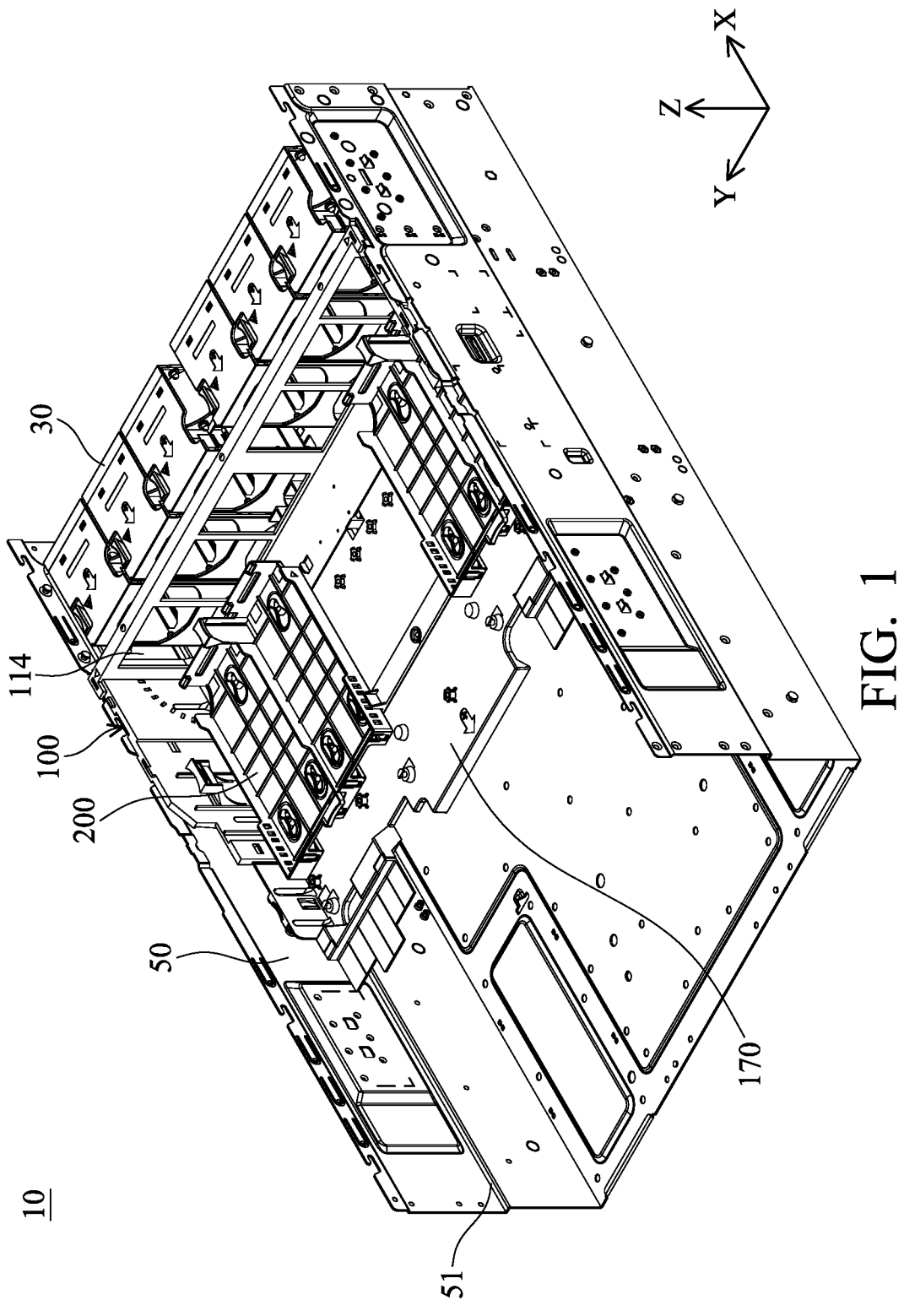
FIG. 1 illustrates a perspective view of an electronic device in accordance with some embodiments of the present disclosure.

FIG. 1 illustrates a perspective view of an electronic device 10 in accordance with some embodiments of the present disclosure. It should be noted that the electronic device 10 may be any suitable electronic device, such as computer apparatus, server apparatus, etc., but is not limited thereto. In some embodiments, the present disclosure merely illustrates a portion of the electronic device 10, and any electronic device that may include this portion falls within the scope of the present disclosure. As shown in FIG. 1, the electronic device 10 includes at least one fan 30, a chassis 50, a tray 100, an extension base 170 and a carrier 200. The fans 30 and the tray 100 may be disposed in the chassis 50. The tray 100 and the extension base 170 may form an accommodating space for installing the carrier 200, so that electronic components (not shown) may be disposed on the carrier 200. In other words, the carrier 200 may be disposed on the tray 100 and the extension base 170. The fans 30 can generate air flow passing through the tray 100 (for example, through the opening portion 114), thereby cooling the electronic components over the tray 100 and reducing the probability of failure of the electronic components due to over temperature. In some embodiments, the carrier 200 may be omitted, and the electronic components may be disposed directly on the tray 100. The electronic components may be any kind of electronic components, depending on the function to be achieved, and will not be described in detail. In addition, in some embodiments, the chassis 50 may be provided with rails 51 to divide the chassis 50 into upper and lower levels, but the present disclosure is not limited thereto. In some embodiments, chassis 50 may not be leveled or divided into more than two levels. In the present embodiment, the fans 30, the tray 100 and the extension base 170 may be disposed on the upper level of the chassis 50, but the present disclosure is not limited thereto. In some embodiments, the fans 30, the tray 100 and the extension base 170 may be disposed on any level of the chassis 50.

Figure 2:
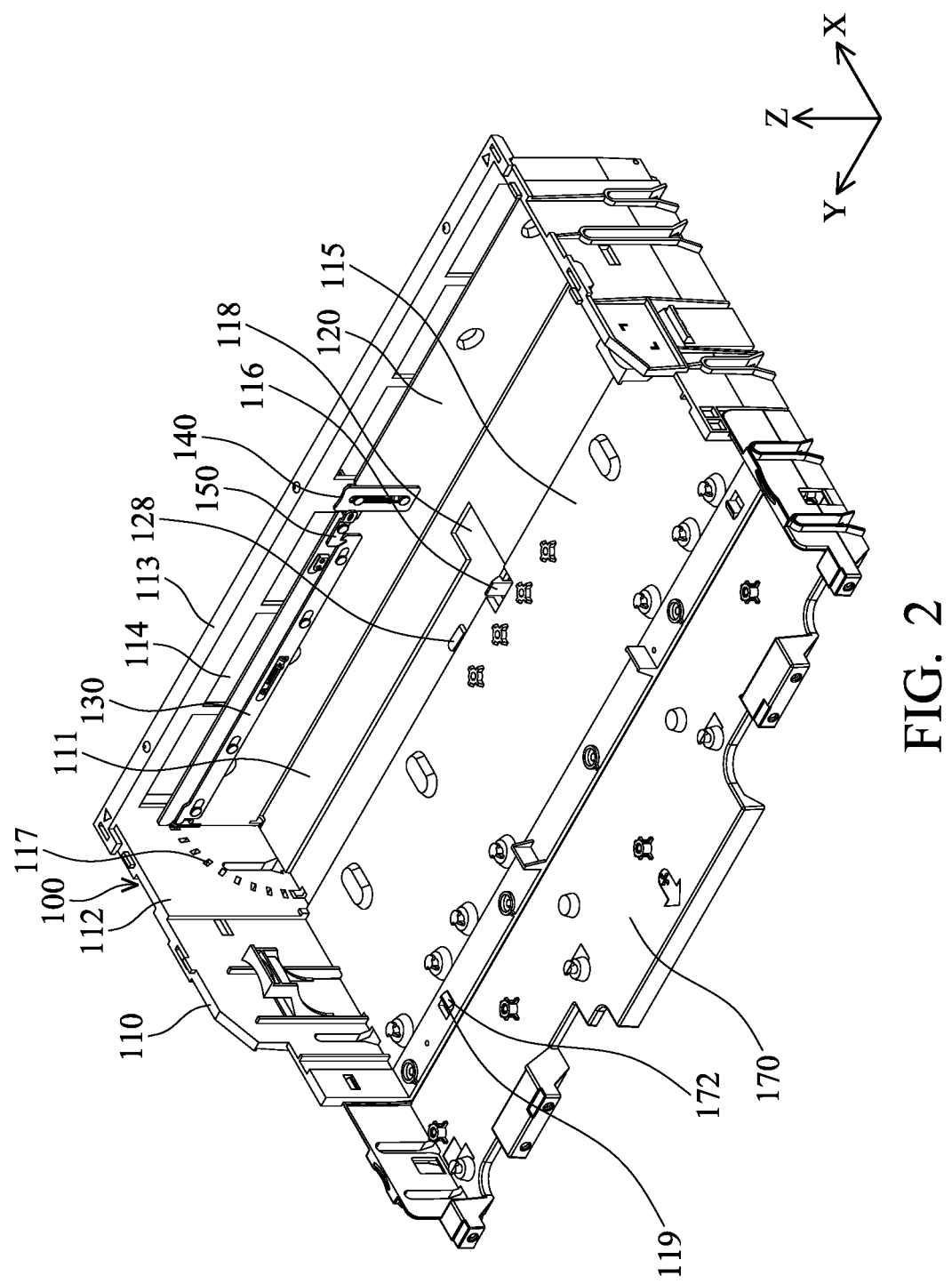
FIG. 2 illustrates a perspective view of a tray and an extension base shown in FIG. 1 in accordance with some embodiments of the present disclosure.

FIG. 2 illustrates a perspective view of the tray 100 and the extension base 170 shown in FIG. 1 in accordance with some embodiments of the present disclosure. As shown in FIG. 2, the tray 100 includes a base 110 that is used to be accommodated in the chassis 50 (for example, referring to FIG. 1). In some embodiments, the base 110 may have a bottom surface 111, and a first sidewall 112 and a second sidewall 113 are substantially perpendicular to the bottom surface 111. The second sidewall 113 is connected to the bottom surface 111 and the first sidewall 112. The electronic components may be disposed on the base 110 and located in the space formed by the bottom surface 111, the first sidewall 112 and the second sidewall 113. The second sidewall 113 may be formed with a plurality of opening portions 114, for example, corresponding to the fans 30 (referring to FIG. 1).

In addition, the tray 100 may further include a bottom plate 115 that is fixed onto the bottom surface 111 of the base 110. In some embodiments, the tray 100 includes a baffle 120, wherein the baffle 120 is rotatably connected to the first sidewall 112 of the base 110 and is used to rotate about the rotation axis R (for example, referring to FIG. 4A) toward the opening portions 114. In some embodiments, the baffle 120 is rotatable between the bottom surface 111 and the second sidewall 113. For example, the baffle 120 may be rotated to a position to be substantially parallel to the bottom surface 111 (or the bottom plate 115), and may also be rotated to a position to be substantially parallel to the second sidewall 113. Of course, all positions between the above-mentioned two positions are also included within the scope of the present disclosure. In addition, the tray 100 further includes a connecting rod 130, a latch 140 and a hook 150 connected to and disposed on one side of the baffle 120 (for example, the side facing the bottom surface 111), to position the baffle 120 or rotating the baffle 120 selectively. The operation of the connecting rod 130, the latch 140 and the hook 150 will be discussed in more detail below with reference to FIGS. 4A to 4C.

In addition, a fastener 116 and a recess 118 are formed on the bottom surface 111. The fastener 116 may protrude in a vertical direction (such as, the Z axis), and is used to engage with the baffle 120 at a position where the baffle 120 is parallel to the bottom surface 111 of the base 110 (such as, parallel to the X-Y plane). The recess 118 accommodates the connecting rod 130, the latch 140 and the hook 150 selectively, whereby when the baffle 120 is received, the baffle 120 may be substantially parallel to the bottom plate 115, providing a relatively flat space for accommodating electronic components. In addition, the extension base 170 may be combined with the tray 100 to provide an extended accommodating space. In some embodiments, the extension base 170 may include a plurality of fastening structures 172 that are used to be fastened into a plurality of grooves 119 of the base 110, respectively. In some embodiments, the grooves 119 may be disposed on the bottom surface 111 and the first sidewall 112 of the base 110, so that the extension base 170 can be stably connected to the tray 100 via the corresponding fastening structure 172.

Figure 4A:
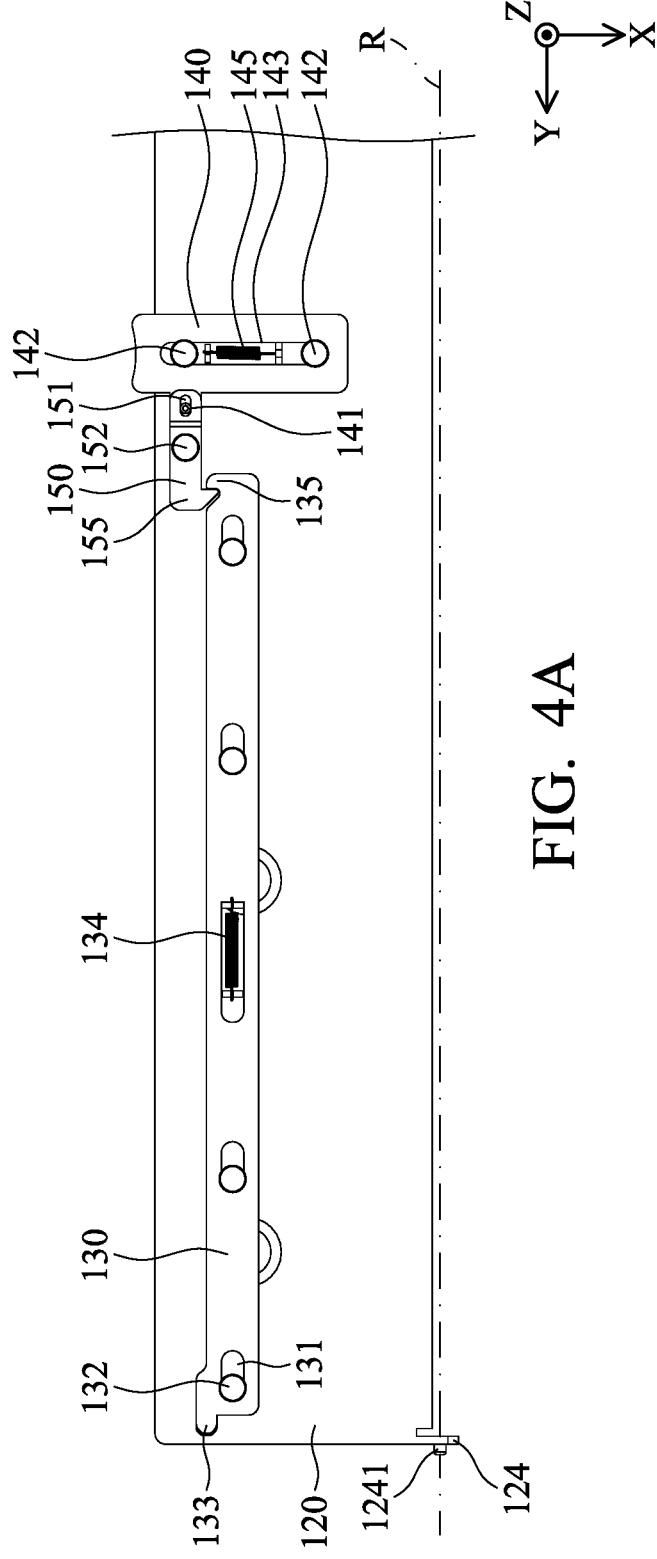
FIGS. 4A to 4C illustrate plan views of the operation of the baffle in accordance with some embodiments of the present disclosure.

In some embodiments, a plurality of slots 117 are formed on the first sidewall 112, and the slots 117 each correspond to the protruding portion 133 of the connecting rod 130 (for example, referring to FIG. 4A). In other words, the protruding portion 133 of the connecting rod 130 is accommodated in one of the slots 117. In this way, the connecting rod 130 as well as the baffle plate 120 may be fixed at the position required by the user using the slots 117. In some embodiments, the slots 117 may be arranged along an arc-shaped profile to correspond to the rotational position of the baffle 120. In addition, an elastic sheet 128 may be affixed on the bottom surface 111 of the base 110 and abut against the baffle 120. In some embodiments, the elastic sheet 128 may be affixed on the bottom surface 111 by means of hot melt. For example, when the baffle 120 is positioned parallel to the bottom plate 115, the elastic sheet 128 may abut against the baffle 120. When the baffle 120 is released from the fastener 116 (i.e., at the time that the baffle 120 leaves the fastener 116), the elastic sheet 128 may exert a force on the baffle 120 to push the baffle 120 to rotate toward the opening portion 114. Thereby, it is easier for the user to rotate the baffle 120 and adjust the baffle 120 to a desired position.

Figure 3:
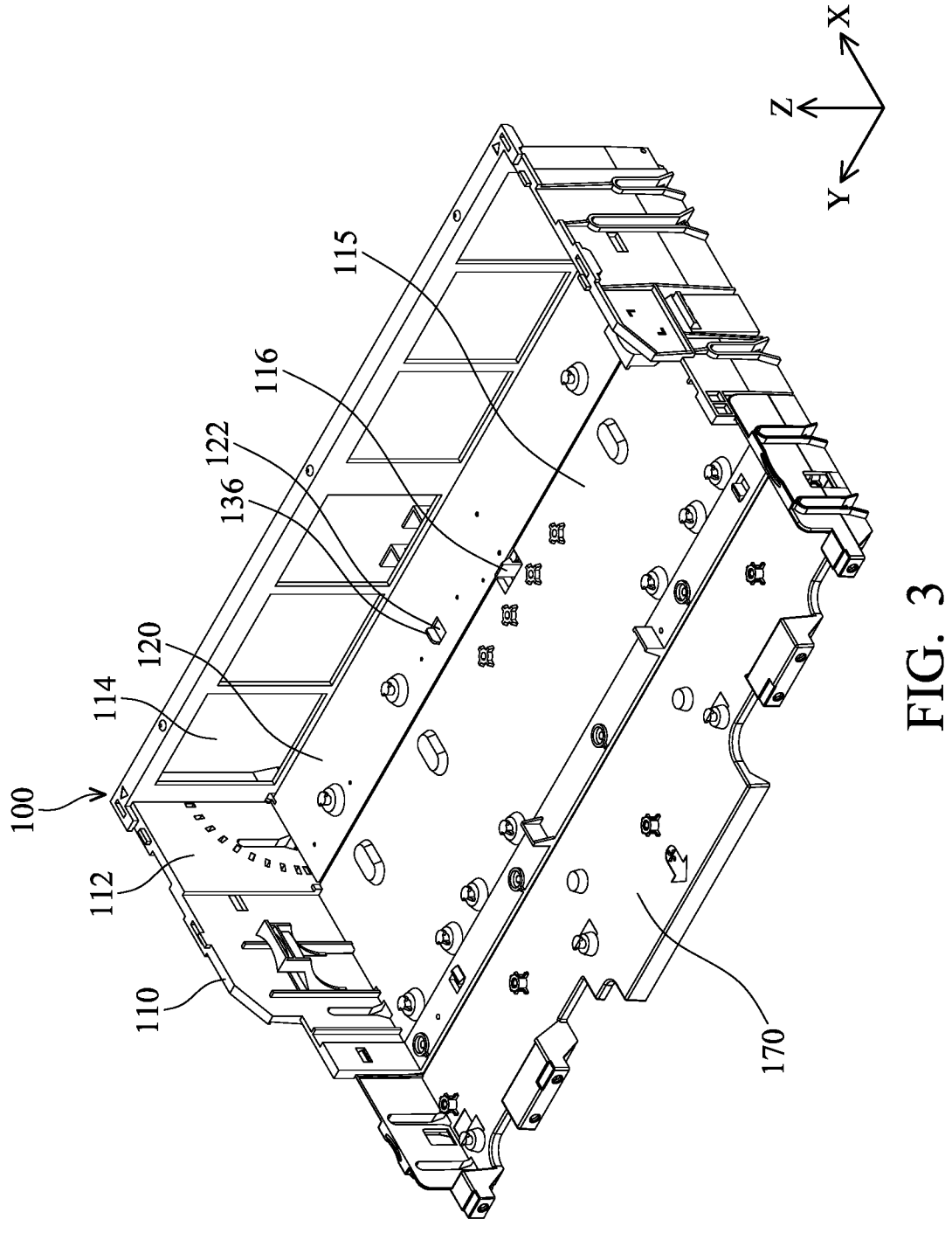
FIG. 3 illustrates a perspective view of the tray and the extension base shown in FIG. 1 in accordance with some embodiments of the present disclosure.

FIG. 3 illustrates a perspective view of the tray 100 and the extension base 170 shown in FIG. 1 in accordance with some embodiments of the present disclosure. As shown in FIG. 3, a sliding hole 122 may be formed in the baffle 120, and a tab 136 may be formed on the connecting rod 130. The tab 136 protrudes from the baffle 120 and is slidably disposed in the sliding hole 122. The user may adjust the position of the connecting rod 130 by pulling the tab 136, so that the protruding portion 133 is able to exit from the one of the slot 117, thereby driving the baffle 120 to rotate. Although the configuration of the tray 100 (including the base 110) is described above, this embodiment merely serves as an example, and those skilled in the art may adjust the configuration of the base 110 according to the content of the present disclosure (for example, to match the configuration of the chassis 50). These various configurations are also encompassed within the scope of the present disclosure.

Figure 4B:
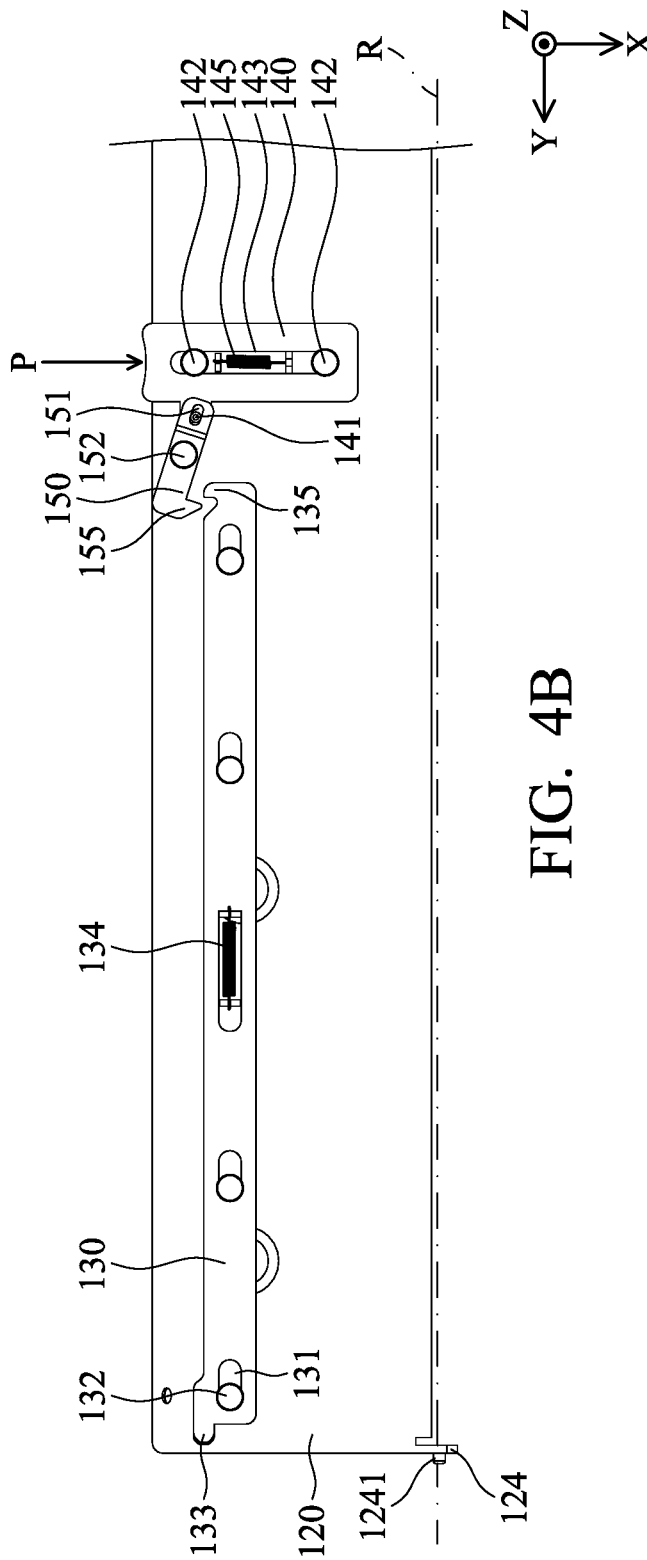
Figure 4C:
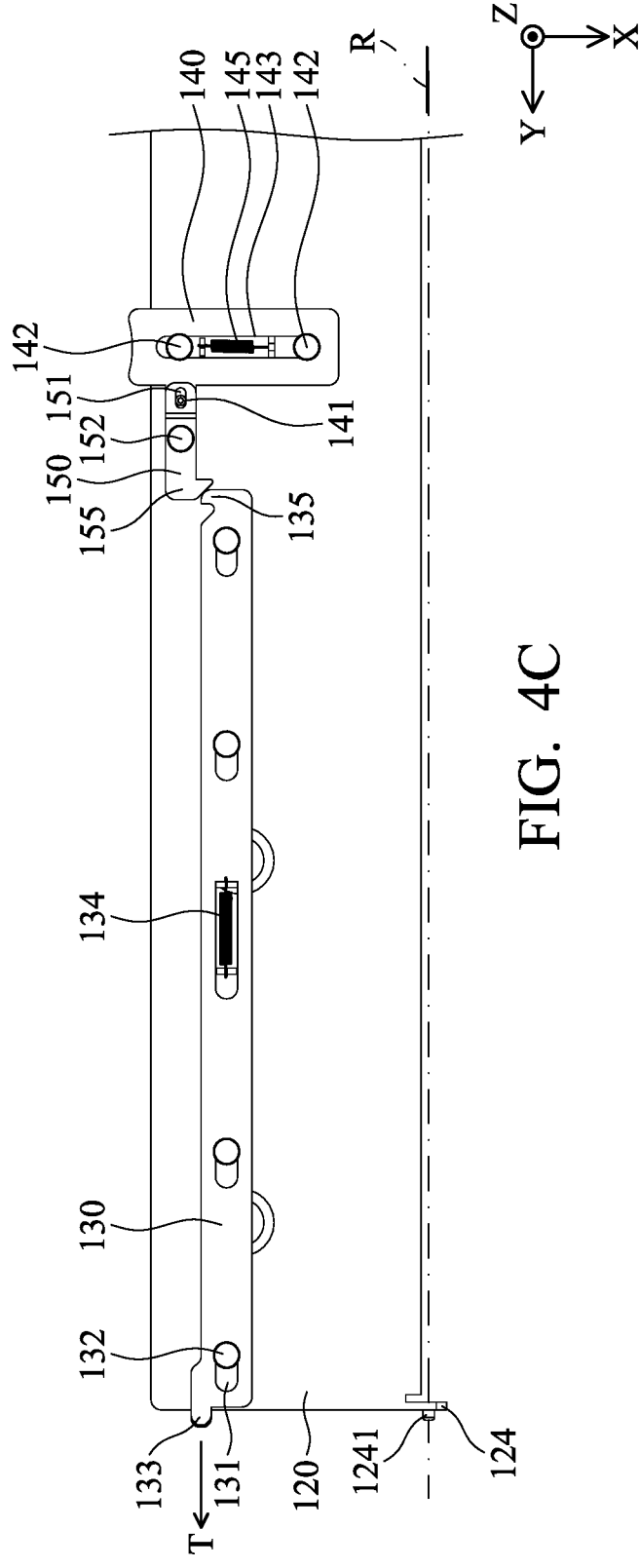

FIGS. 4A to 4C illustrate plan views of the operation of the baffle 120 in accordance with some embodiments of the present disclosure. As shown in FIG. 4A, a connecting arm 124 is formed on the baffle 120, and the connecting arm 124 is formed with a bump 1241, which protrudes toward the first sidewall 112 and corresponds to the hole 1121 (for example, referring to FIG. 5) of the first sidewall 112. As a result, the baffle 120 is rotatable around the bump 1241. That is, the rotation axis R of the baffle 120 passes through the bump 1241 of the connecting arm 124.

In some embodiments, the connecting rod 130 may be connected to the baffle 120 via a plurality of pins 132. More specifically, the connecting rod 130 may be provided with a plurality of sliding holes 131, and the pins 132 are respectively accommodated in one of the sliding holes 131 and affixed to the baffle plate 120 (for example, affixed in the holes 121 of the baffle 120, referring to FIG. 7B). Therefore, the connecting rod 130 is movable relative to the baffle 120 in the lengthwise direction (for example, along the Y axis) of the sliding holes 131. In addition, the connecting rod 130 is provided with an elastic element 134, which is used to push the connecting rod 130 to move in a horizontal direction (for example, along the positive Y axis). In some embodiments, the above-mentioned horizontal direction is substantially parallel to the rotation axis R of the baffle 120. In addition, the connecting rod 130 may be formed with a protruding portion 133 and a hook portion 135 on opposite sides. The protruding portion 133 is used to position in one of the slots 117 of the first sidewall 112. The hook portion 135 is used to connect with the hook 150. Since the elastic element 134 continuously pushes the connecting rod 130, in the absence of external force, the protruding portion 133 will remain in the corresponding slot 117. In this way, it may be ensured that after the user adjusts the position of the baffle 120, the baffle 120 is maintained in the adjusted position.

In some embodiments, the latch 140 includes a pin 141 that is connected to the hook 150 and a fastener 142 that is connected to the baffle 120. The fastener 142 may be disposed in a sliding hole 143 of the latch 140 and correspondingly located in the hole 123 (for example, referring to FIG. 6B) of the baffle plate 120. An elastic element 145 is disposed in the latch 140 and located in the sliding hole 143. The elastic element 145 pushes the latch 140 to move in a vertical direction (for example, the positive X axis), and the vertical direction is substantially perpendicular to the rotation axis R of the baffle 120.

In some embodiments, the hook 150 connects the latch 140 and the connecting rod 130 selectively. For example, the hook 150 is formed with a sliding hole 151, a fastener 152 and a hook portion 155. The sliding hole 151 is used to receive the pin 141 of the latch 140. The fastener 152 is used to be fixed to the baffle plate 120, and the hook 150 is rotatable around the fastener 152. In this way, the movement of the latch 140 may drive the hook 150 to rotate. In addition, the hook portion 155 may be disposed corresponding to the hook portion 135 of the connecting rod 130. Thereby, the hook 150 may connect the latch 140 and the connecting rod 130, and therefore the connecting rod 130, the latch 140 and the hook 150 form a linkage mechanism.

In the present embodiment, the user may pull the tab 136 of the connecting rod 130 to move the connecting rod 130 to the right (for example, along the negative Y axis). In this case, the force exerted by the user on the connecting rod 130 is greater than the force of the elastic element 134 to push the connecting rod 130 to the left (for example, along the positive Y axis), so that the protruding portion 133 of the connecting rod 130 leaves the corresponding slot 117, and the hook portion 135 of the connecting rod 130 may be engaged with the hook portion 155 of the hook 150. At this time, the user may move the baffle 120 to an appropriate position as required.

Next, as shown in FIG. 4B, when the user moves the baffle 120 for positioning, the user presses the latch 140 in a direction P (for example, the positive X axis), so that the latch 140 is in a free state. At this time, the elastic element 145 of the latch 140 will pull the latch 140 to move in the direction P and drive the hook 150 to rotate, for example, in a clockwise direction with the fastener 152 as the center (as viewed in a top view). Accordingly, the hook portion 155 of the hook 150 is released from the hook portion 135 of the connecting rod 130. In this way, the connecting rod 130 may be disengaged from the hook 150 and is movable freely without being affected by the latch 140 and the hook 150.

Next, as shown in FIG. 4C, since the elastic element 134 continuously pushes the connecting rod 130, the protruding portion 133 moves in a direction T (for example, the positive Y axis) into the corresponding slot 117 to position the baffle 120. It should be noted that the user can repeat the operations shown in FIGS. 4A to 4C to move the baffle 120 to other positions (such as, any position corresponding to the slots 117). The operation of each position will not be listed one by one below.

Figure 5:
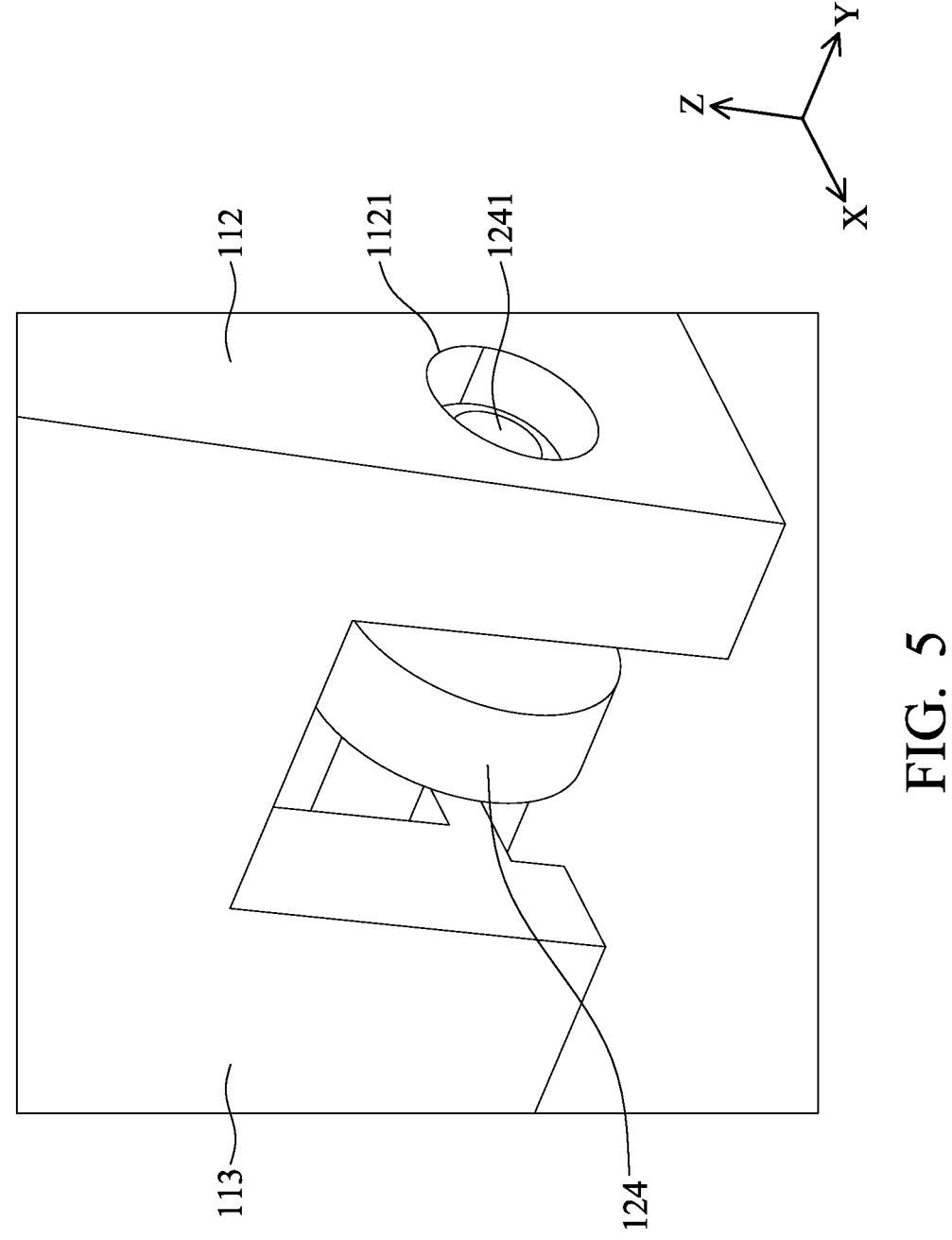
FIG. 5 illustrates a partial perspective view of the base and the tray in accordance with some embodiments of the present disclosure.

FIG. 5 illustrates a partial perspective view of the base 110 and the baffle 120 in accordance to some embodiments of the present disclosure. As shown in FIG. 5, the bump 1241 formed on the connecting arm 124 of the baffle 120 protrudes toward the first sidewall 112 and corresponds to the hole 1121 of the first sidewall 112. For example, the bump 1241 may be disposed in the hole 1121 by extrusion deformation, so that the baffle 120 is rotatable around the bumps 1241. In some embodiments, the hole 1121 is a through hole passing through the first sidewall 112, but the present disclosure is not limited thereto. In other embodiments, the hole 1121 is a blind hole that does not pass through the first sidewall 112.

Figure 6A:
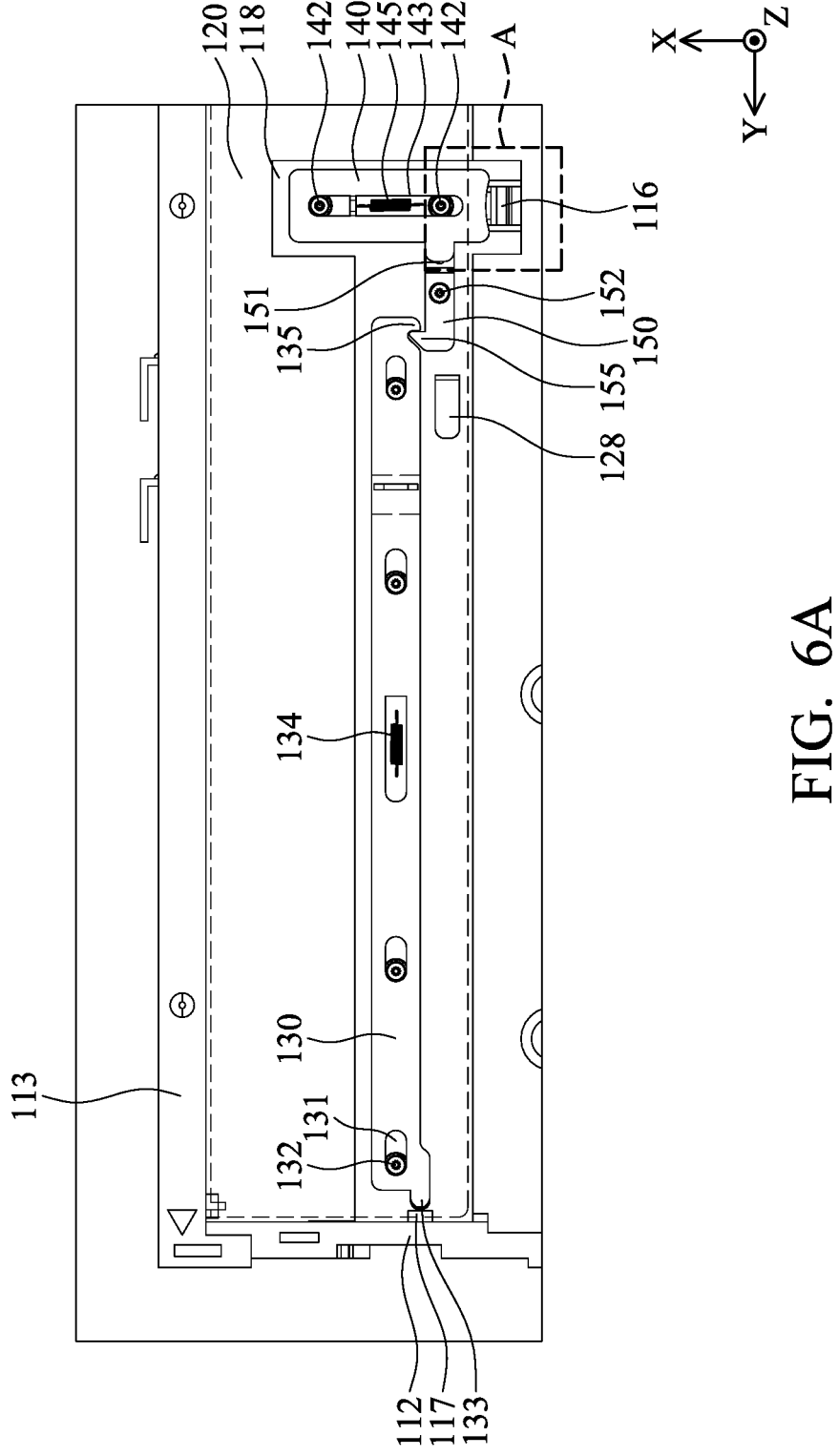
FIG. 6A illustrates a plan view of the operation of the baffle in accordance with some embodiments of the present disclosure.

FIG. 6A illustrates a plan view of the operation of the baffle 120 in accordance with some embodiments of the present disclosure. It should be noted that FIG. 6A, FIG. 7A and FIG. 8A, for example, illustrate a series of operations for affixing the baffle 120 at a position where the baffle 120 is parallel to the bottom surface 111 using the fastener 116. In addition, in order to clearly show the detailed structures of the connecting rod 130, the latch 140 and the hook 150, the baffle 120 is shown in dotted lines in this embodiment. Similar to FIG. 4A, the user may pull the tab 136 of the connecting rod 130 to move the connecting rod 130 to the right (for example, along the negative Y axis), and the protruding portion 133 will leave the corresponding slot 117. At this time, the user may exert force to the baffle 120 to rotate the baffle 120 toward the bottom surface 111.

Figure 6B:
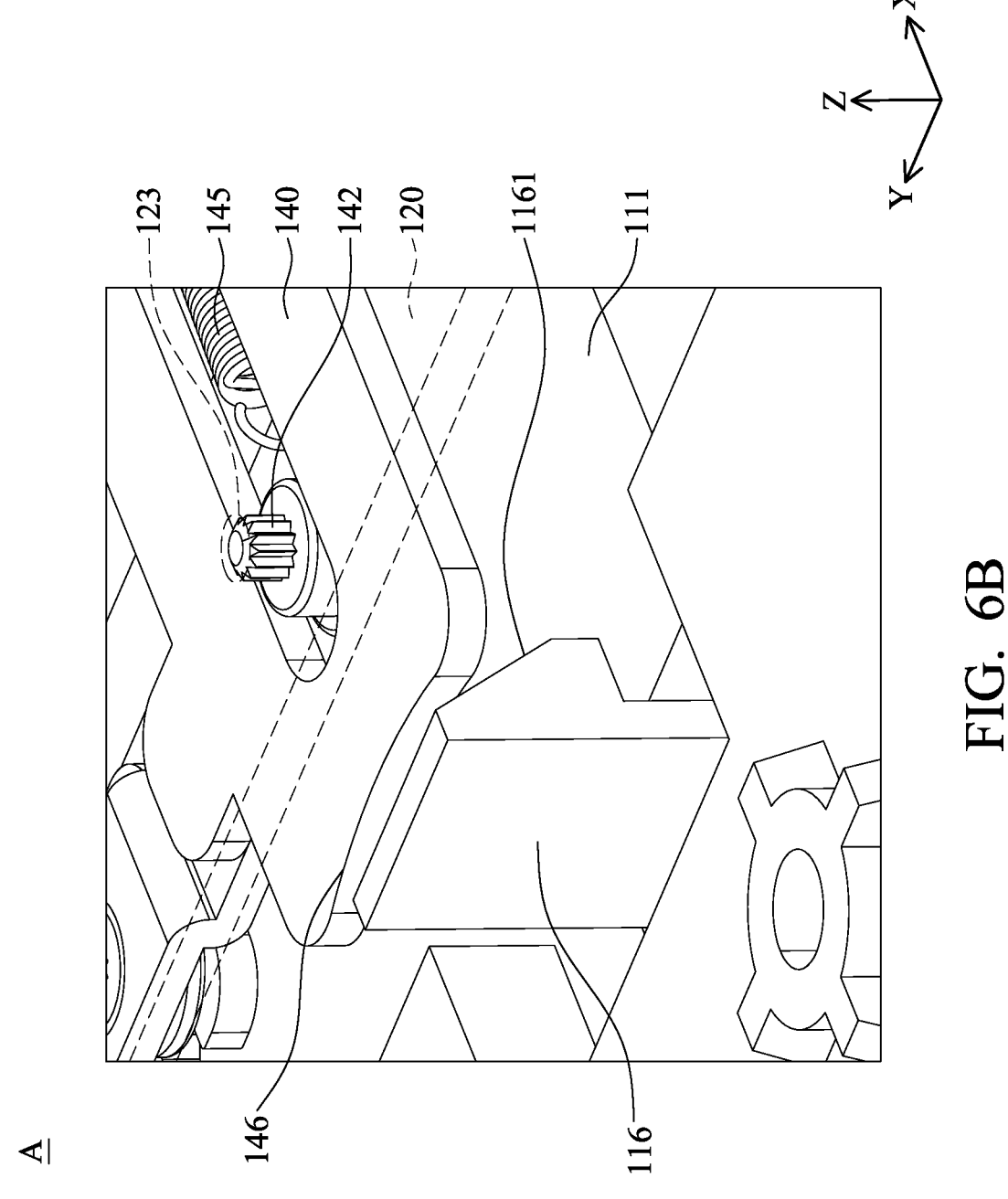
FIG. 6B illustrates a partial enlarged view of the region A of the tray shown in FIG. 6A in accordance with some embodiments of the present disclosure.

FIG. 6B illustrates a partial enlarged view of the region A of the tray 100 shown in FIG. 6A in accordance with some embodiments of the present disclosure. As shown in FIG. 6B, the latch 140 has an arc profile 146 corresponding to the fastener 116. More specifically, the arc profile 146 of the latch 140 may naturally fall along the guide surface 1161 of the fastener 116. The movement modes of the latch 140 will be further described below with reference to FIG. 7A.

Figure 7A:
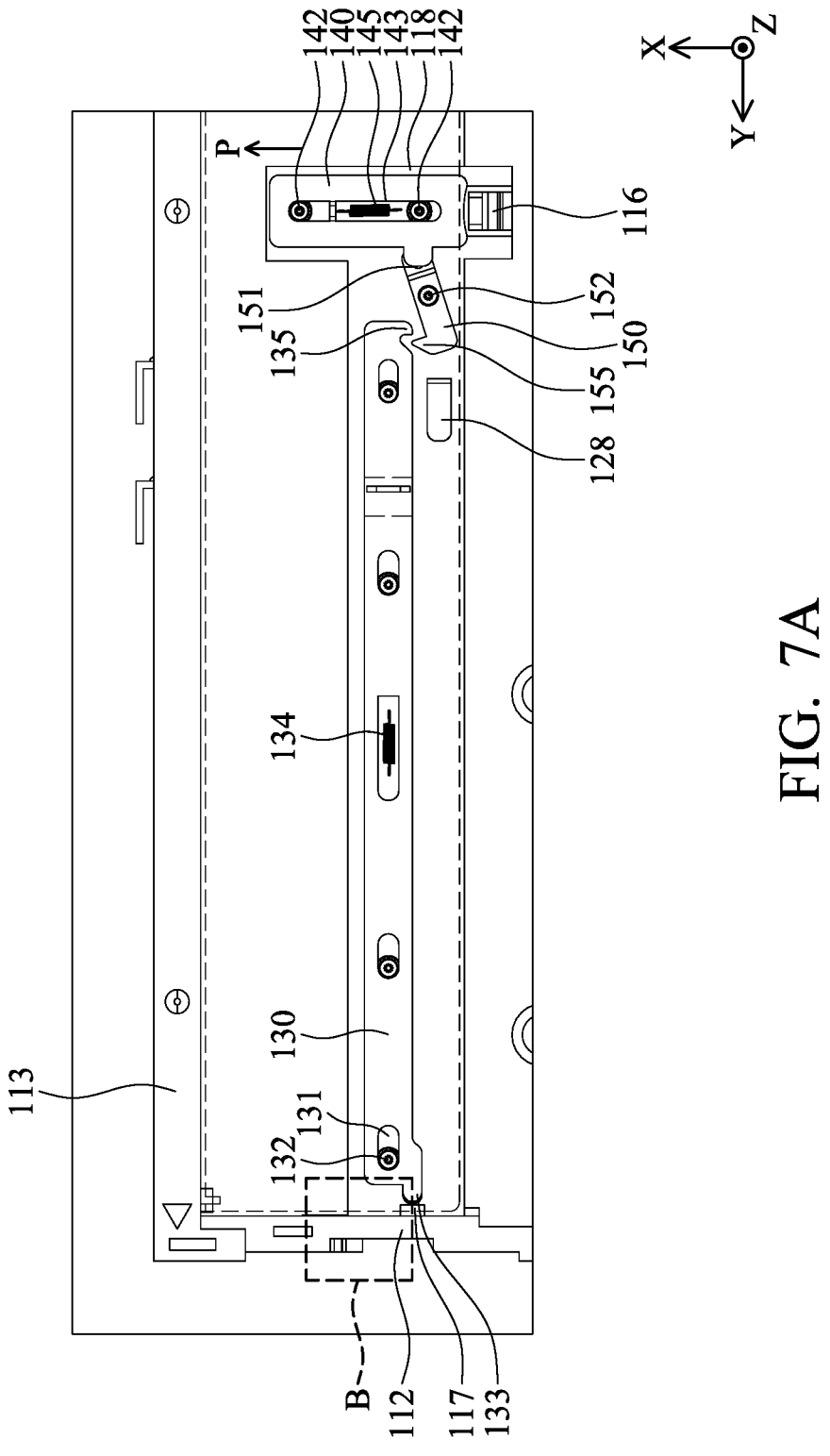
FIG. 7A illustrates a plan view of the operation of the baffle in accordance with some embodiments of the present disclosure.

As shown in FIG. 7A, the elastic element 145 of the latch 140 pushes the latch 140 to move in the direction P (for example, the positive X axis), and drive the hook 150 to rotate in, for example, a counterclockwise direction (as viewed in a top view), so that the hook portion 155 of the hook 150 is released from the hook portion 135 of the connecting rod 130. In this way, the connecting rod 130 may be disengaged from the hook 150 and is movable freely without being affected by the latch 140 and the hook 150.

Figure 7B:
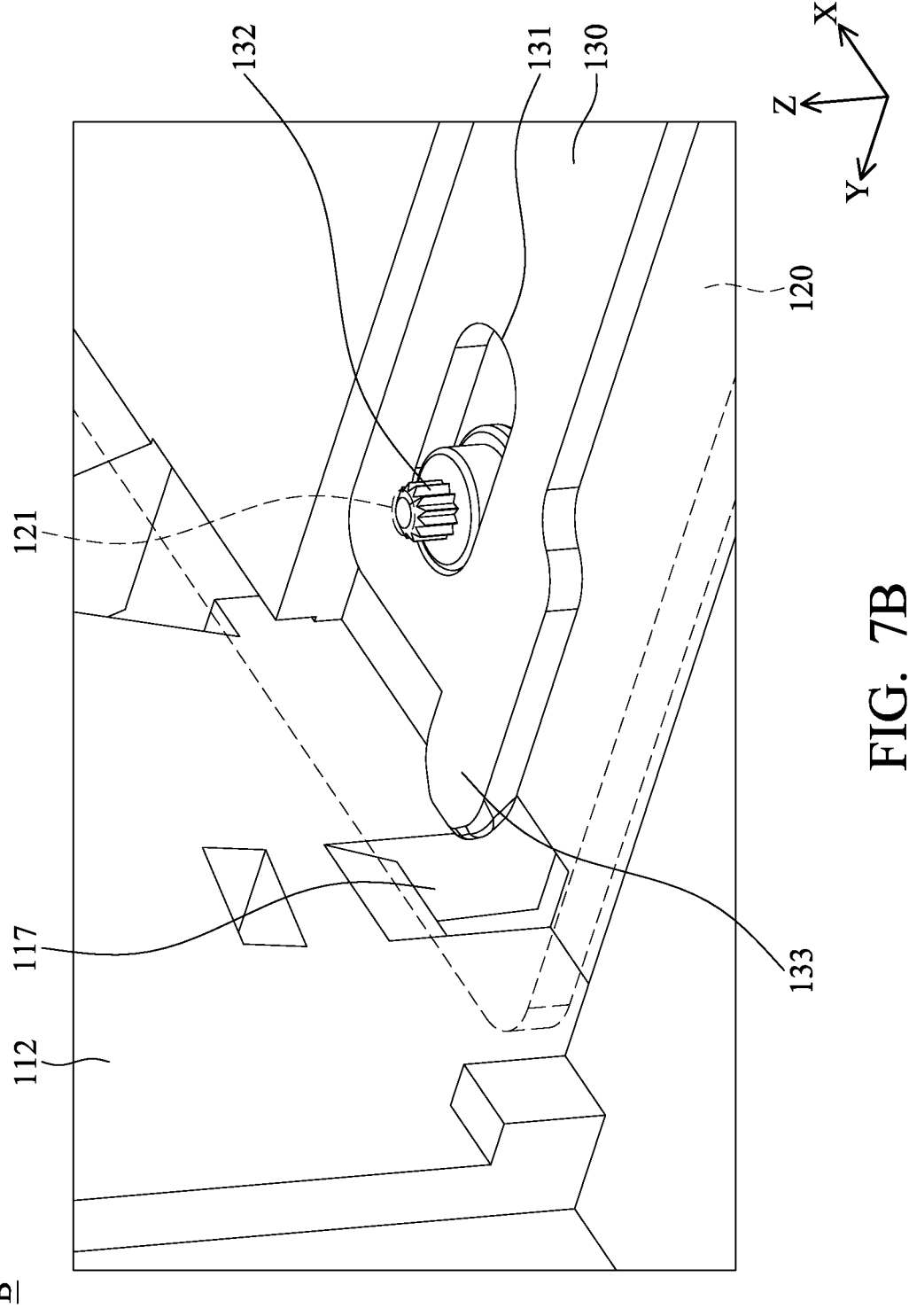
FIG. 7B illustrates a partial enlarged view of the region B of the tray shown in FIG. 7A in accordance with some embodiments of the present disclosure.

FIG. 7B illustrates a partial enlarged view of the region B of the tray 100 shown in FIG. 7A in accordance with some embodiments of the present disclosure. As shown in FIG. 7B, when the baffle 120 is positioned (for example, parallel to the bottom surface 111), the protruding portion 133 of the connecting rod 130 may be aligned with the lowermost slot 117.

Figure 8A:
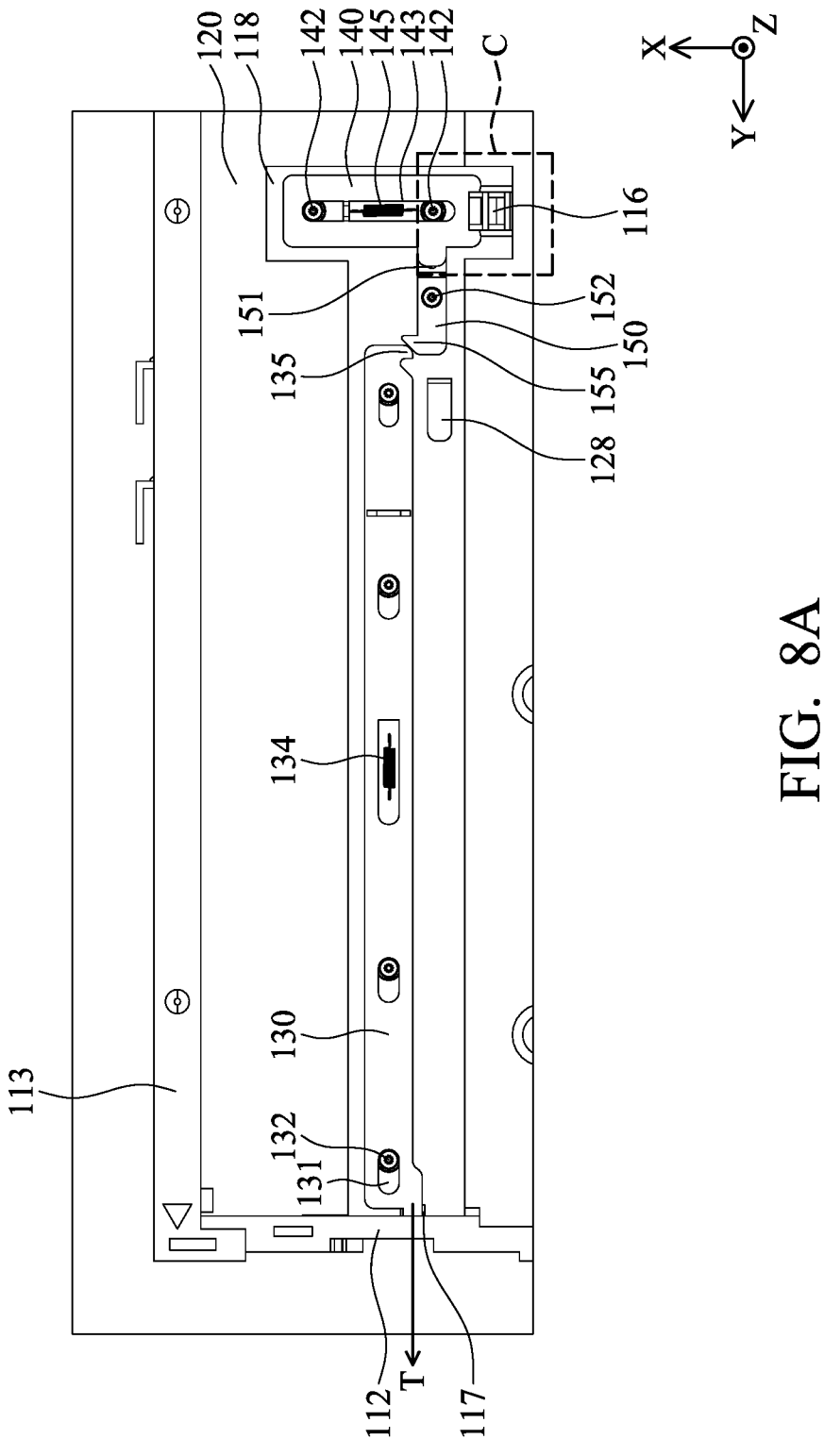
FIG. 8A illustrates a plan view of the operation of the baffle in accordance with some embodiments of the present disclosure.
Figure 8B:
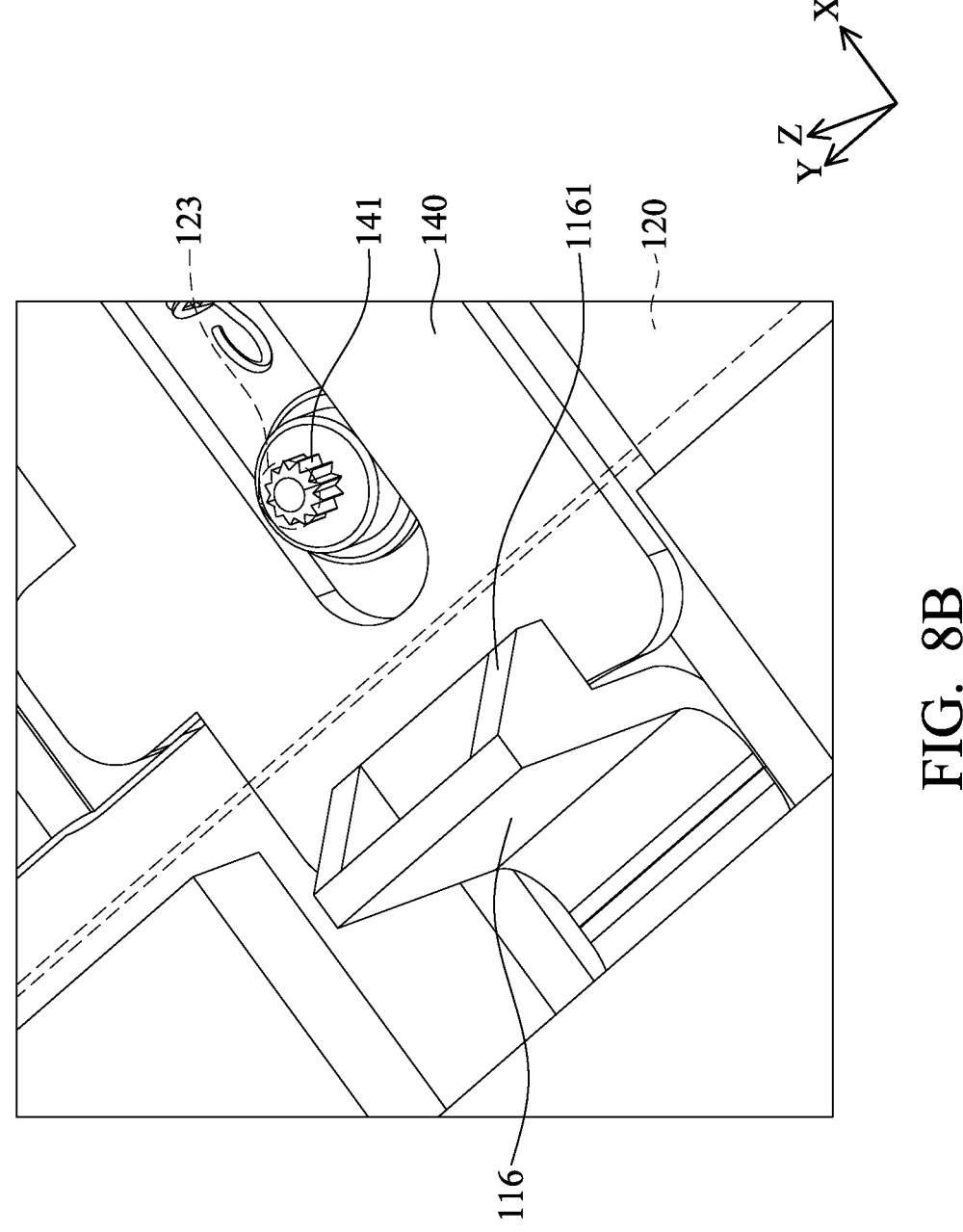
FIG. 8B illustrates a partial enlarged view of the region C of the tray shown in FIG. 8A in accordance with some embodiments of the present disclosure.

As shown in FIG. 8A, following the above state, since the elastic element 134 continuously pushes the connecting rod 130, the protruding portion 133 moves in the direction T (for example, along the positive Y axis) into the above-mentioned slot 117. FIG. 8B illustrates a partial enlarged view of the region C of the tray 100 shown in FIG. 8A in accordance with some embodiments of the present disclosure. As shown in FIG. 8B, the latch 140 may be guided by the arc profile 146 along the guide surface 1161 of the fastener 116 to fall into the region below the fastener 116, so that the connecting rod 130, the latch 140 and the hook 150 of the baffle 120 are accommodated in the recess 118, and the baffle 120 is affixed to the lowermost slot 117 at this position, and will not move to other positions arbitrarily, so that the baffle 120 is integrally engaged at the position and parallel to the bottom surface 111 of the base 110 (for example, parallel to the X-Y plane). On the contrary, if the user wants to move the baffle 120 to another position, the fastener 116 needs to be pulled, and the elastic sheet 128 will provide an upward force for the baffle 120 to push the baffle 120 away from the recess 118, and then the user may adjust the position of the baffle 120 as required.

Figure 9:
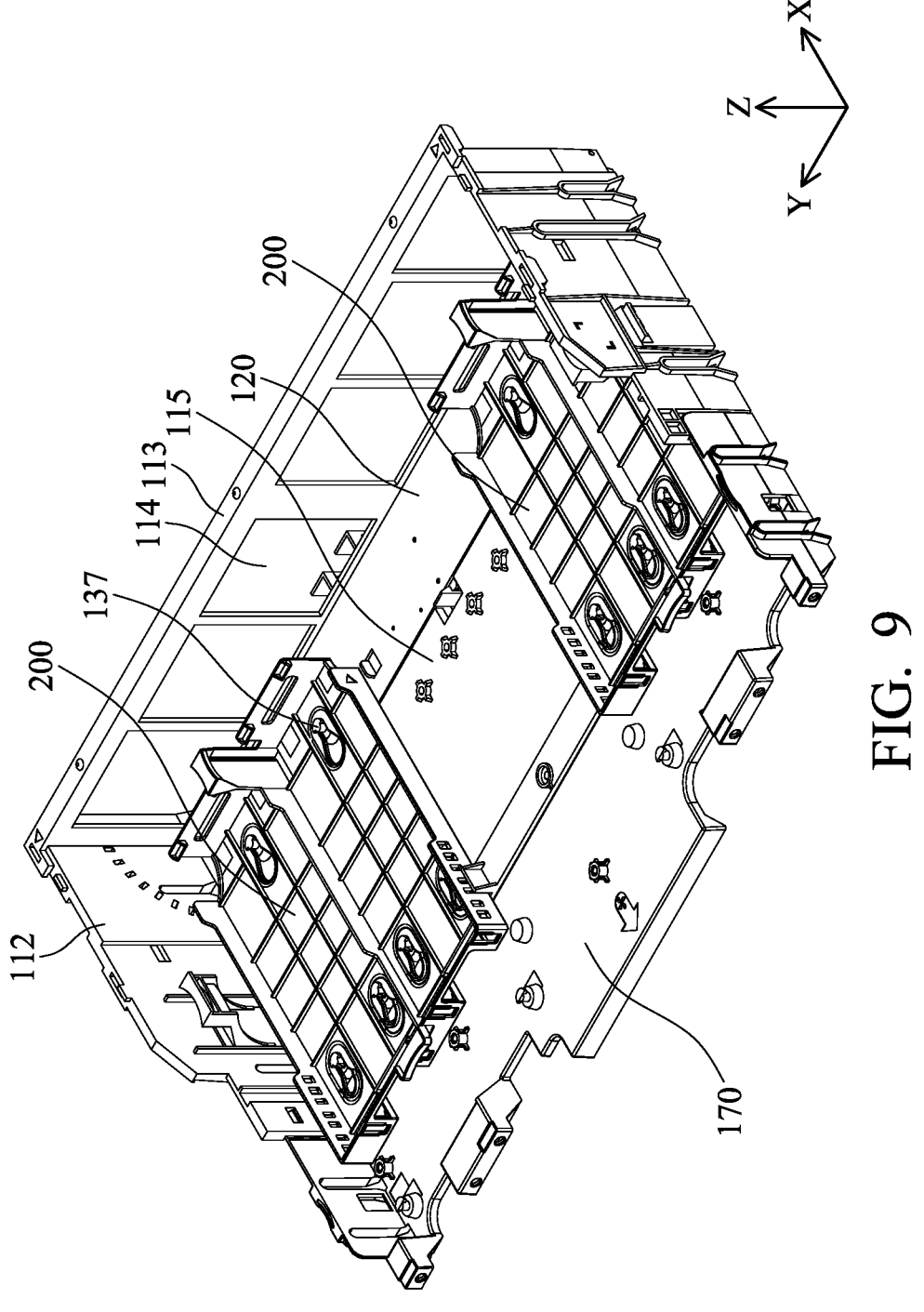
FIG. 9 illustrates a perspective view of the tray, the extension base, and the carrier shown in FIG. 1 in accordance with some embodiments of the present disclosure.

FIG. 9 illustrates a perspective view of the tray 100, the extension base 170, and the carrier 200 shown in FIG. 1 in accordance with some embodiments of the present disclosure. As shown in FIG. 9, when the baffle 120 is positioned parallel to the bottom surface 111, the carrier 200 may be further disposed over the baffle 120. In this way, additional space may be provided for the carrier 200 and/or the electronic components (not shown) above. In some embodiments, the baffle 120 may have a positioning member 137, which is configured for mounting and positioning the carrier 200, which may improve the accuracy of disposing the carrier 200, or reduce the probability that the carrier 200 is not properly installed. With the arrangement of the rotatable baffle 120, it is possible to adjust the flow rate and angle of the air flow from the fan 30 in the tray 100 with a single structure, or to provide more space for arranging electronic components. As a result, the number of installations of different apparatus for different devices may be reduced, and the tray 100 may be convenient enough for use.

Figure 10:
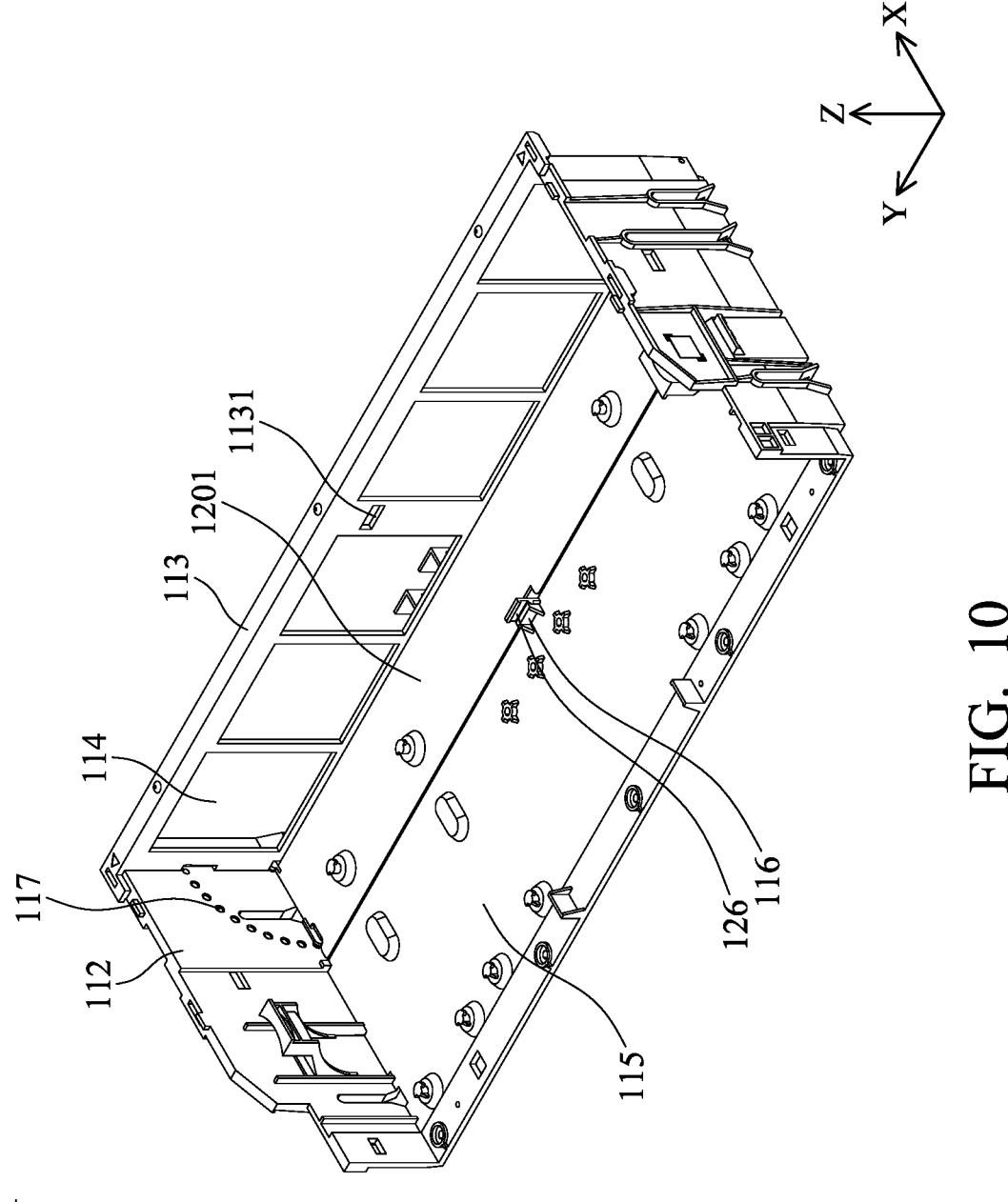
FIG. 10 illustrates a perspective view of the tray in accordance with some embodiments of the present disclosure.

FIG. 10 illustrates a perspective view of a tray 101 in accordance with some embodiments of the present disclosure. It should be noted that the tray 101 in this embodiment may include the same or similar structures as the tray 100 shown in FIGS. 1 to 9. These same or similar structures will be denoted by the same or similar reference numerals, and will not be described in detail below. As shown in FIG. 10, the tray 101 may include a baffle 1201, wherein the baffle 1201 is formed with an elastic arm 126 are received in a groove 1111 formed on the bottom surface 111 (for example, referring to FIG. 10), or fastened into the hole 1131 (for example, referring to FIG. 11) of the second sidewall 113 selectively. For example, the elastic arm 126 may include a U-shaped structure, and may be formed of a material with suitable elasticity. In some embodiments, the elastic arm 126 and the baffle 1201 are formed in one piece. The user may move the baffle 1201 (such as, rotate the baffle 1201 relative to the opening portions 114) by operating the elastic arm 126. In some embodiments, the baffle 1201 may form a connecting arm 127 (for example, referring to FIG. 12) having a bump 1271, which is used to be received in the corresponding slot 117.

Figure 11:
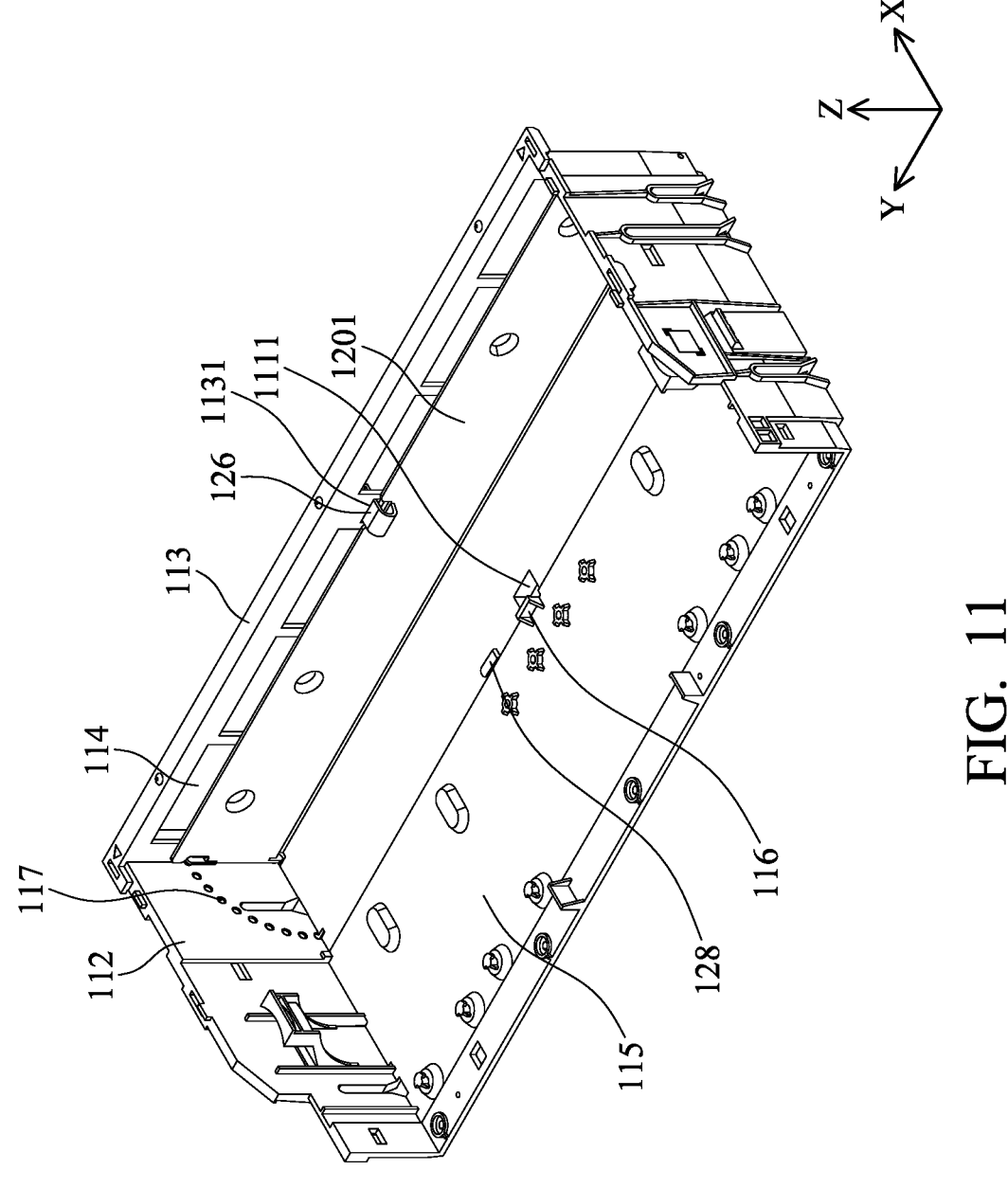
FIG. 11 illustrates a perspective view of the tray in accordance with some embodiments of the present disclosure.

FIG. 11 illustrates a perspective view of the tray 101 in accordance with some embodiments of the present disclosure. As shown in FIG. 11, the elastic arm 126 may be fastened into the hole 1131 of the second sidewall 113 to affix the baffle 1201 at a position where the baffle 1201 is substantially parallel to the second sidewall 113. In some embodiments, the hole 1131 may be located between adjacent opening portions 114, but the present disclosure is not limited thereto. With the arrangement of the elastic arm 126, the mechanism suitable for moving the baffle 1201 may be simplified, and the manufacturing cost may be reduced or the reliability of the whole mechanism may be improved.

Figure 12:
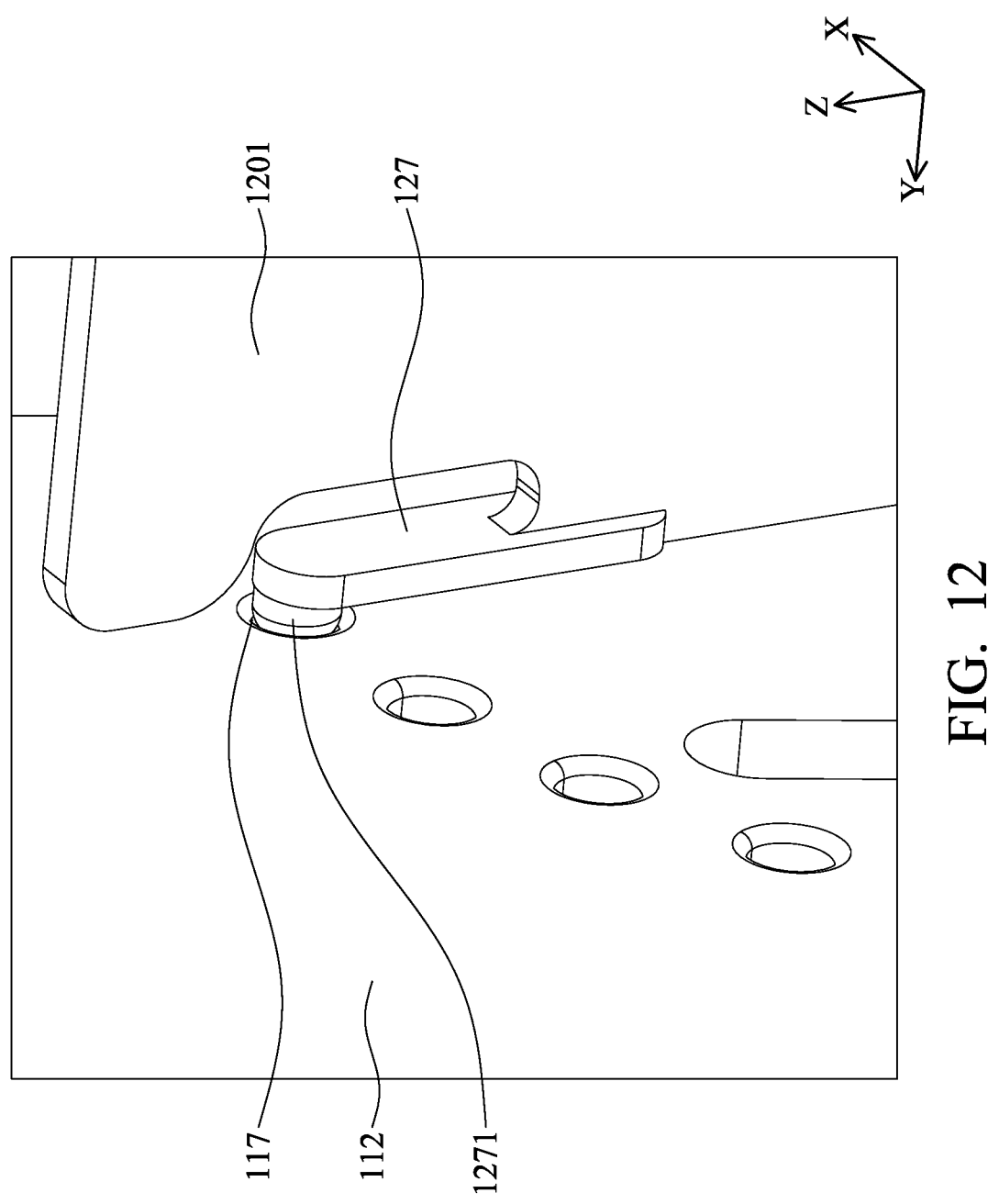
FIG. 12 illustrates a partial enlarged view of the tray in accordance with some embodiments of the present disclosure.

FIG. 12 illustrates a partially enlarged perspective view of the tray 101 in accordance with some embodiments of the present disclosure. As shown in FIG. 12, a positioning arm 127 may be formed on the baffle 1201. The positioning arm 127 may have a bump 1271, which protrudes toward the first sidewall 112 and corresponds to the slot 117 of the first sidewall 112. For example, the bump 1271 may be received in one of the slots 117 so that the baffle 120 may be positioned at a position set by the user. In some embodiments, the positioning arm 127 may be formed by a material with suitable elasticity. As a result, when the user moves the baffle 1201 by operating the elastic arm 126, the bump 1271 of the positioning arm 127 may be released from the original slot 117 without hindering the movement of the baffle 1201. When the user moves the baffle 1201 to be positioned, the bump 1271 of the positioning arm 127 may be moved into the corresponding slot 117. At this time, the positioning arm 127 is movable toward the first sidewall 112 automatically, so that the bump 1271 is accommodated in the corresponding slot 117.

In summary, the present disclosure provides a tray and an electronic device including a rotatable baffle. In some embodiments, the baffle may be affixed in place using a linkage mechanism composed of a connecting rod, a latch and a hook. In other embodiments, an elastic arm may be formed on the baffle for affixing the baffle at the position corresponding to the slot. In this way, the flow rate and angle of the airflow through the opening portions may be adjusted by the rotation of the baffle. In addition, the baffle may also be accommodated in the base, so that both the tray and the baffle may carry electronic components. Adjusting the flow rate and angle of the airflow from the fan may be achieved in a single-structured tray, or more space may be provided for electronic components. Therefore, the tray is convenient enough for use.

While the embodiments and the advantages of the present disclosure have been described above, it should be understood that those skilled in the art may make various changes, substitutions, and alterations to the present disclosure without departing from the spirit and scope of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. As long as those may perform substantially the same function in the aforementioned embodiments and obtain substantially the same result, they may be used in accordance with some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. A tray, provided for an electronic device, comprising:
a base having a bottom surface, a first sidewall and a second sidewall, wherein the first sidewall, the second sidewall, and the bottom surface are connected to together to define a space, and a plurality of opening portions are formed on the second sidewall; and
a baffle disposed in the space and rotatably connected to the first sidewall, wherein the baffle is rotatable between a first position parallel to the bottom surface and a second position parallel to the second sidewall, wherein, when the baffle is parallel to the second sidewall, a top end of the baffle overlaps the opening portion in a normal direction of the second sidewall, so that the opening is partially covered by the baffle.

2. The tray as claimed in claim 1, further comprising a bottom plate affixed to the bottom surface of the base, wherein a recess is formed on the bottom surface, when the baffle rotates to a parallel position and is parallel to the bottom plate, the baffle matches the recess.

3. The tray as claimed in claim 2, wherein a fastener is formed on the bottom surface of the base, when the baffle is parallel to the bottom plate, the fastener is affixed with the baffle in the parallel position.

4. The tray as claimed in claim 3, wherein the fastener has a guiding surface, and the guiding surface is inclined to the bottom surface of the base.

5. The tray as claimed in claim 1, further comprising a connecting rod slidably disposed at the baffle, wherein a plurality of slots are formed on the first sidewall, and the connecting rod of the baffle is positioned in one of the slots selectively.

6. The tray as claimed in claim 5, wherein the connecting rod has a protruding portion, the protruding portion is accommodated in one of the slots.

7. The tray as claimed in claim 6, further comprising a first elastic element disposed in the baffle and connected to the connecting rod, wherein the connecting rod is pushed toward the first sidewall via the first elastic element.

8. The tray as claimed in claim 6, wherein a sliding hole is formed in the baffle, a tab is formed on the connecting rod, and the tab is slidably disposed in the sliding hole.

9. The tray as claimed in claim 6, further comprising:
a latch disposed on the baffle; and
a hook rotatably disposed on the baffle, wherein the hook connects the latch and the connecting rod, and the connecting rod is positioning via the hook selectively.

10. The tray as claimed in claim 9, wherein the latch comprises a second elastic element, the latch is pushed via the second elastic element to move in a direction, and the direction is perpendicular to the rotation axis which the baffle rotates along.

11. The tray as claimed in claim 1, wherein a plurality of slots are formed on the first sidewall, and the baffle has a positioning arm, the positioning arm has a bump, and the bump is selectively accommodated in one of the slots.

12. The tray as claimed in claim 2, further comprising an elastic sheet affixed onto the bottom surface of the base, wherein when the baffle rotates to the parallel position where the baffle is parallel to the bottom plate, the elastic sheet is abutted against the baffle.

13. The tray as claimed in claim 1, wherein the baffle has an elastic arm engaged with a hole of the second sidewall.

14. An electronic device, comprising:
a chassis;
a plurality of fans disposed in the chassis; and
a tray, removably disposed in the chassis, comprising:
a base having a bottom surface, a first sidewall and a second sidewall, wherein the first sidewall, the second sidewall, and the bottom surface are connected to together to define a space, a plurality of opening portions are formed on the second sidewall, and the opening portions correspond to the fans; and
a baffle disposed in the space and rotatably connected to the first sidewall, wherein the baffle is rotatable between a first position parallel to the bottom surface and a second position parallel to the second sidewall, wherein, when the baffle is parallel to the second sidewall, a top end of the baffle overlaps the opening portion in a normal direction of the second sidewall, so that the opening is partially covered by the baffle.

15. The electronic device as claimed in claim 14, further comprising an extension base, wherein a plurality of fastening structures are formed on the extension base, and the base has a plurality of grooves, and each fastening structure is fastened into a respective groove selectively.

16. The electronic device as claimed in claim 15, wherein the fastening structures are fastened to the bottom surface and the first sidewall of the base.

17. The electronic device as claimed in claim 15, further comprising a carrier disposed on the base and the extension base, wherein an electronic component is accommodated on the carrier.

18. The electronic device as claimed in claim 17, wherein the bottom surface of the base has a fastener, when the baffle is parallel to the bottom surface, the fastener is affixed with the baffle in a parallel position, and the carrier is disposed on the baffle.

19. The electronic device as claimed in claim 14, further comprising a connecting rod slidably disposed at the baffle, wherein a plurality of slots are formed on the first sidewall of the tray, and the connecting rod of the baffle is positioned in one of the slots selectively.

20. The electronic device as claimed in claim 19, wherein the connecting rod has a protruding portion which is accommodated in one of the slots selectively;

a latch disposed on the baffle and slidable in a direction; and a hook rotatably disposed on the baffle and connecting the connecting rod and the latch.

21. The electronic device as claimed in claim 14, wherein a plurality of slots are formed on the first sidewall, and the baffle has a positioning arm, the positioning arm has a bump, and the bump is selectively accommodated in one of the slots.

* * * * *